US011233078B2

(12) United States Patent
Cho

(10) Patent No.: US 11,233,078 B2
(45) Date of Patent: Jan. 25, 2022

(54) IMAGE SENSING DEVICE INCLUDING DUMMY PIXELS

(71) Applicant: SK hynix Inc., Gyeonggi-Do (KR)

(72) Inventor: Sung Wook Cho, Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 145 days.

(21) Appl. No.: 16/205,035

(22) Filed: Nov. 29, 2018

(65) Prior Publication Data

US 2020/0043962 A1 Feb. 6, 2020

(30) Foreign Application Priority Data

Jul. 31, 2018 (KR) .................. 10-2018-0089199

(51) Int. Cl.
*H01L 27/146* (2006.01)

(52) U.S. Cl.
CPC .... *H01L 27/14605* (2013.01); *H01L 27/1463* (2013.01); *H01L 27/14621* (2013.01); *H01L 27/14623* (2013.01); *H01L 27/14627* (2013.01)

(58) Field of Classification Search
CPC ......... H01L 27/14605; H01L 27/14627; H01L 27/1463; H01L 27/14645; H01L 27/14643–14647; H01L 27/1462–14629; H01L 27/14601–14607; H01L 27/14621; H01L 27/14636; H01L 27/14623
See application file for complete search history.

(56) References Cited

U.S. PATENT DOCUMENTS

| | | | |
|---|---|---|---|
| 10,121,808 B1* | 11/2018 | Han | H01L 27/14627 |
| 2005/0281942 A1* | 12/2005 | Park | G02B 3/0056 |
| | | | 427/66 |
| 2015/0318318 A1* | 11/2015 | Nam | H01L 27/14605 |
| | | | 257/432 |
| 2015/0348914 A1 | 12/2015 | Takazawa et al. | |
| 2015/0350529 A1* | 12/2015 | Kato | H04N 5/232122 |
| | | | 348/345 |
| 2016/0071896 A1* | 3/2016 | Kawabata | H01L 27/14605 |
| | | | 348/294 |
| 2016/0172412 A1* | 6/2016 | Lee | H01L 27/14605 |
| | | | 257/432 |
| 2017/0077164 A1* | 3/2017 | Kawabata | H01L 27/14627 |
| 2017/0338265 A1* | 11/2017 | Yoshiba | H04N 9/04557 |
| 2018/0308883 A1* | 10/2018 | Yanagita | H04N 5/35563 |
| 2020/0035729 A1* | 1/2020 | Lee | H01L 27/14627 |

FOREIGN PATENT DOCUMENTS

KR 10-0763758 B1 10/2017

* cited by examiner

*Primary Examiner* — Mark W Tornow
*Assistant Examiner* — Priya M Rampersaud
(74) *Attorney, Agent, or Firm* — Perkins Coie LLP

(57) ABSTRACT

An image sensing device in which overlay pixels are formed in a dummy pixel region is disclosed. The image sensing device includes a first dummy pixel region including a first micro-lens, a second dummy pixel region surrounding the first dummy pixel region and formed without micro-lens, and a third dummy pixel region surrounding the second dummy pixel region and including a plurality of second micro-lenses. A center point of the first micro-lens is aligned with a center point of the first photoelectric conversion element, and a center point of the second micro-lenses is shifted in a certain direction from a center point of the third photoelectric conversion elements.

19 Claims, 7 Drawing Sheets

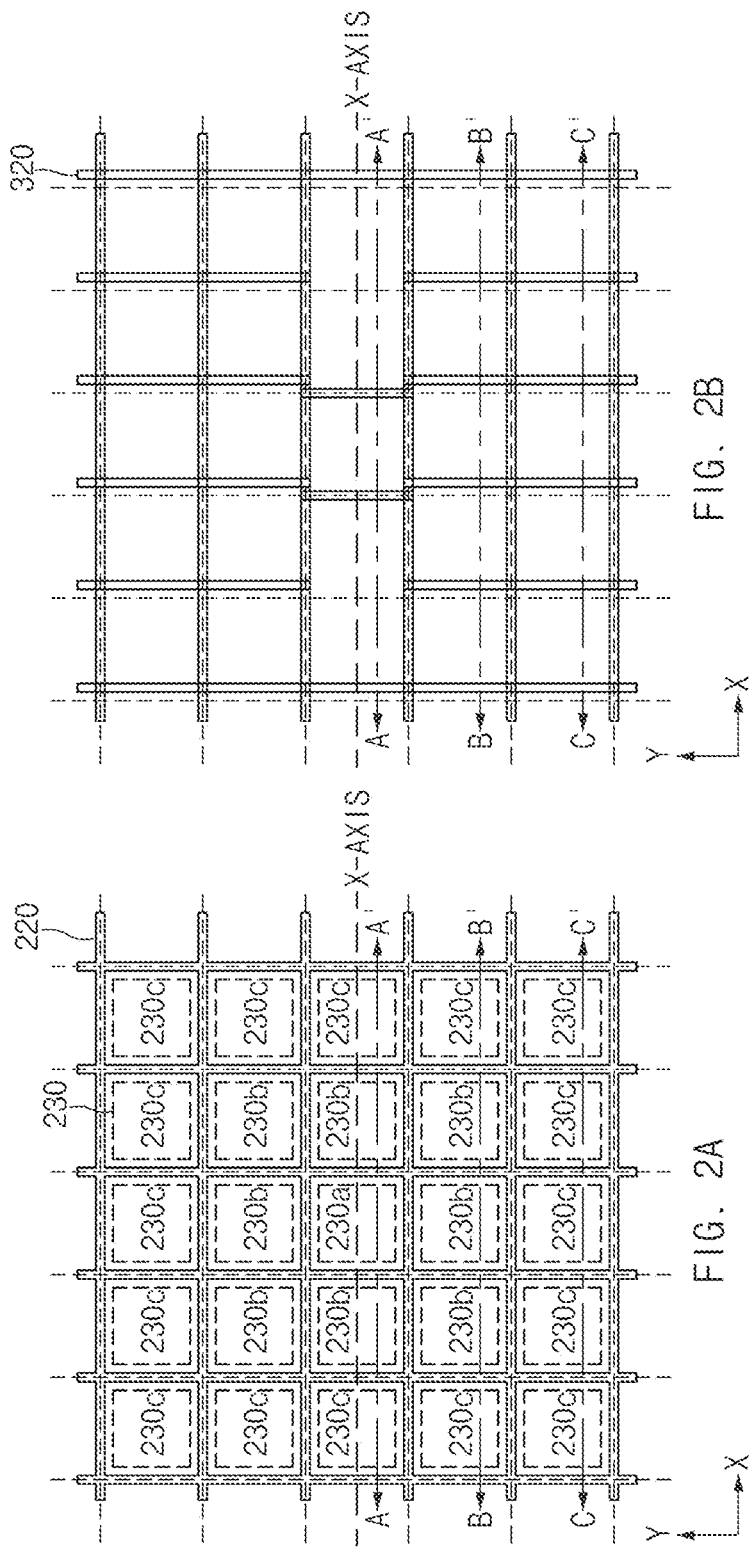

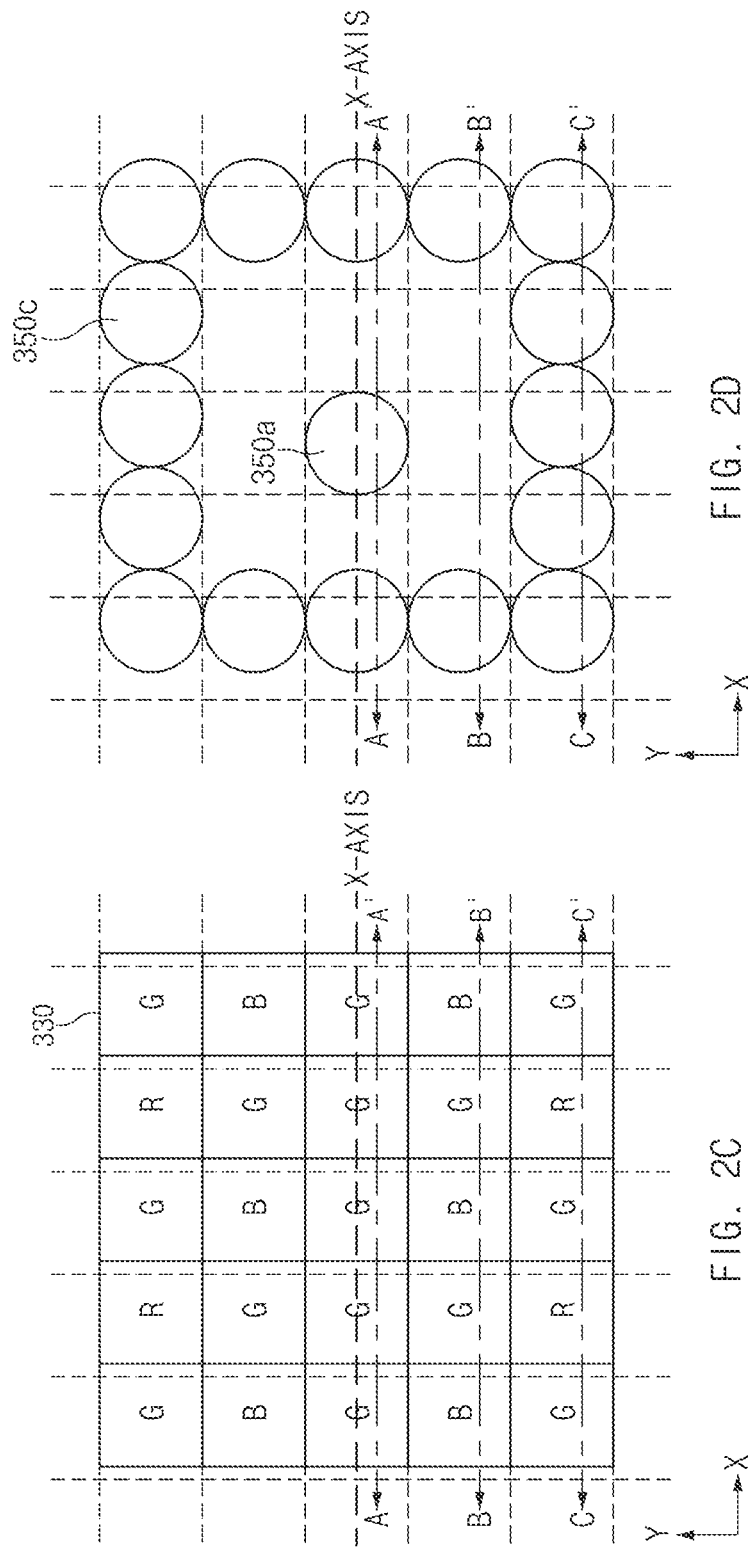

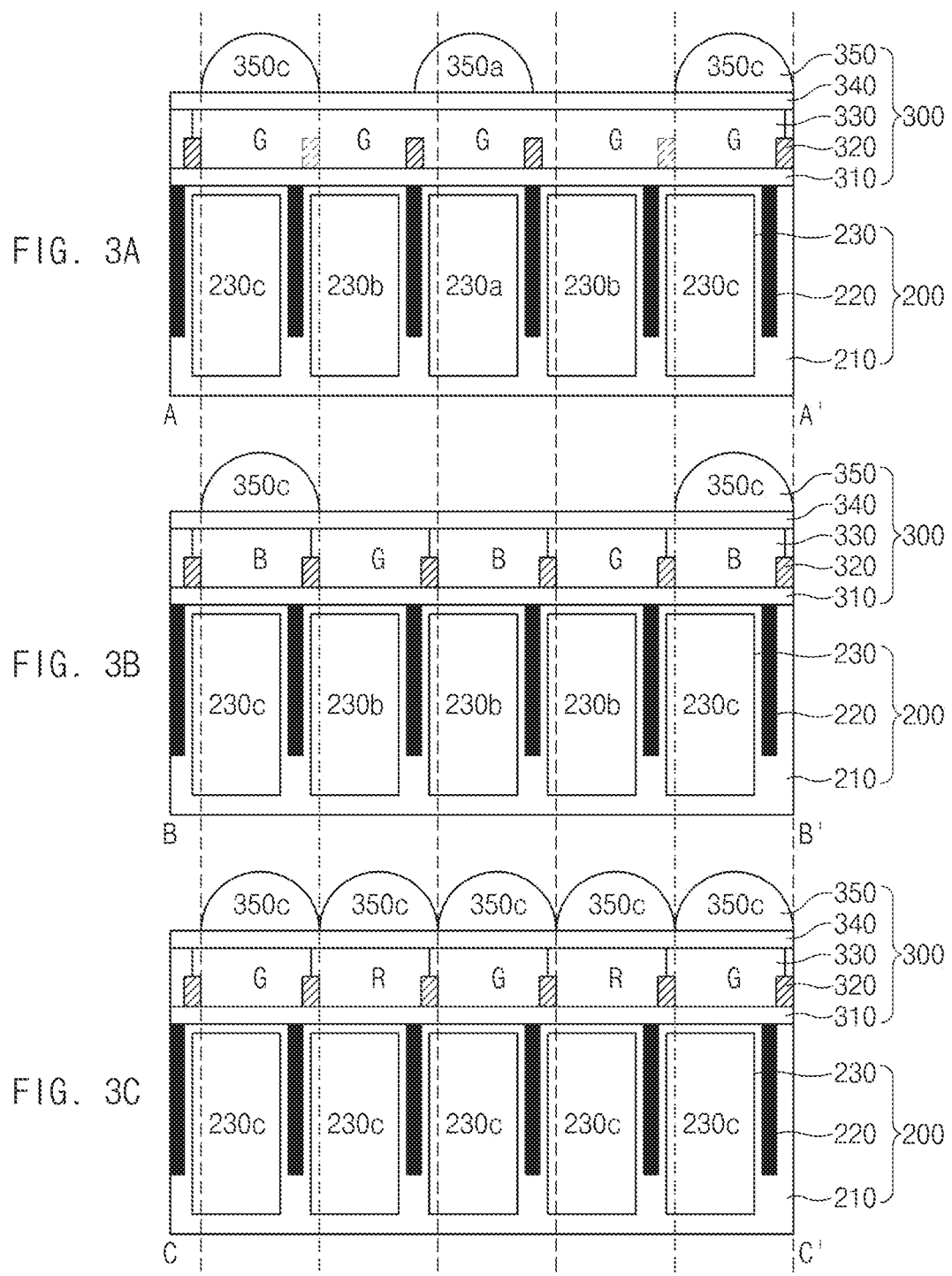

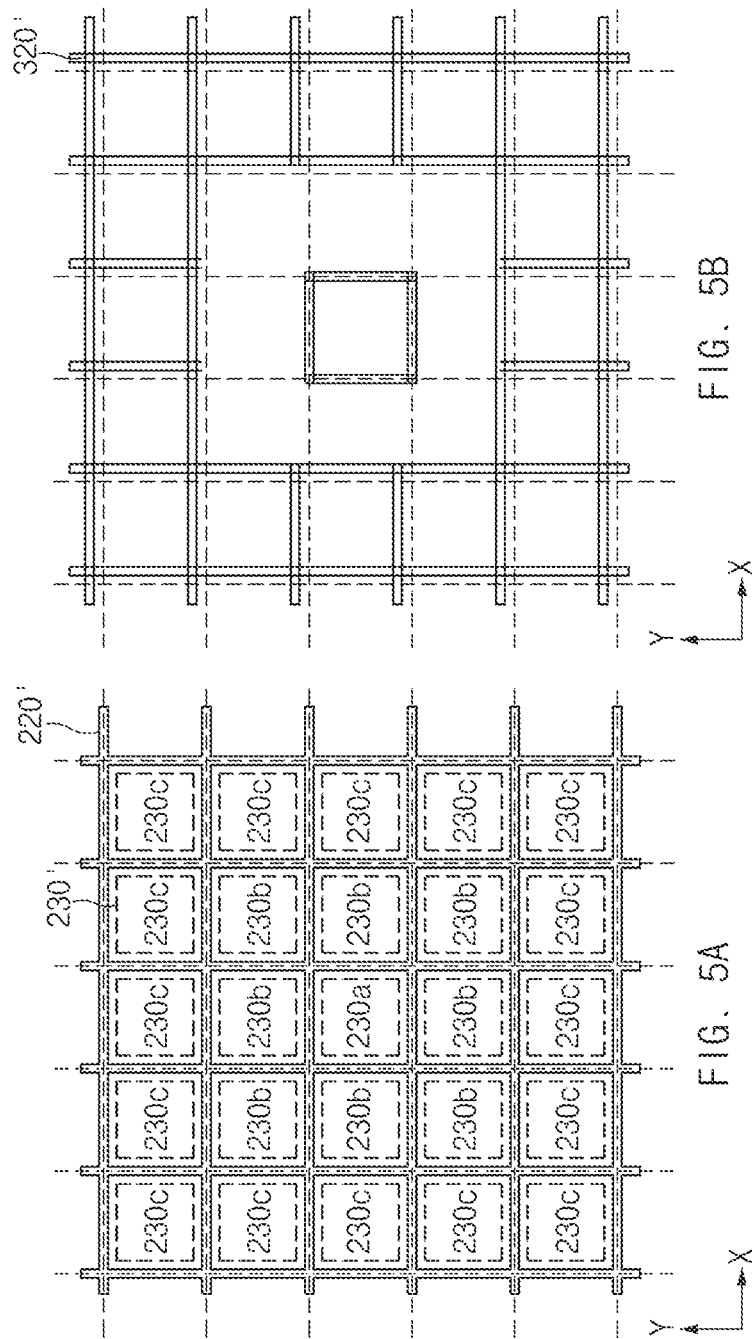

IMAGE SENSING DEVICE INCLUDING DUMMY PIXELS

CROSS-REFERENCE TO RELATED APPLICATION

This patent document claims the priority and benefits of Korean patent application No. 10-2018-0089199 filed on Jul. 31, 2018, the disclosure of which is incorporated herein by reference.

TECHNICAL FIELD

The technology and implementations disclosed in this patent document relate to an image sensing device.

BACKGROUND

An image sensing device is a device that captures light from an optical image or one or more objects using photosensitive semiconductor elements and converts the captured light into electrical signals. In recent times, the development of automotive, medical, computer and communication industries is leading to the increasing demand for high-speed, high-performance image sensors in various technical fields such as digital cameras, camcorders, personal communication systems (PCSs), game consoles, surveillance cameras, medical micro-cameras, robots, etc.

One very common type of image sensing device is a charge coupled device (CCD), which has dominated the field of image sensors for a long time. Another common type of image sensing device is a complementary metal oxide semiconductor (CMOS) image sensing device. The CMOS image sensing devices are now widely used because CMOS-based image sensors can provide certain advantages over the CD counterparts, including, e.g., combining an analog control circuit and a digital control circuit onto a single integrated circuit (IC).

SUMMARY

This patent document provides, among others, designs of an image sensing device including dummy pixels that can enhance image data accuracy.

The dummy pixels implemented based on an embodiment of the disclosed technology may allow image sensing device manufacturers to easily check whether main pixels are arranged as desired and easily search for an overlay pattern in a top-view.

In an embodiment of the disclosed technology, an image sensing device includes a first pixel region formed to include a first photoelectric conversion element, a first color filter, and a first micro-lens, a second pixel region formed to surround the first pixel region and include a plurality of second photoelectric conversion elements and a plurality of second color filters, and a third pixel region formed to surround the second pixel region and include a plurality of third photoelectric conversion elements, a plurality of third color filters, and a plurality of second micro-lenses. A center point of the first micro-lens is aligned with a center point of the first photoelectric conversion element, and a center point of the second micro-lenses is shifted in one side direction from a center point of the third photoelectric conversion elements.

In another embodiment of the disclosed technology, an image sensing device includes a first pixel region formed to include a first pixel, a second pixel region formed to surround the first pixel region, and include a plurality of second pixels, a third pixel region formed to surround the second pixel region, and include a plurality of third pixels; at least one isolation layer formed to define active regions of the first to third pixels, and grid structures formed over the isolation layer, and located at boundary regions of the first to third pixels. A first grid structure located at a boundary region of the first pixel is aligned with the isolation layer, and a second grid structure located at boundary regions of the second and third pixels is shifted in a certain direction from the isolation layer.

In another embodiment of the disclosed technology, an image sensing device includes an active pixel region formed to include a plurality of active pixels that convert incident light into pixel signals representing a capture image carried by the incident light, and a dummy pixel region located outside of the active pixel region to convert incident light into signals that are not used to represent the capture image carried by the incident light. The dummy pixel region includes a first dummy pixel and second dummy pixels formed in a peripheral part of the first dummy pixel. The first dummy pixel includes a first photoelectric conversion element, a first color filter formed over the first photoelectric conversion element, and a first micro-lens formed over the first color filter. The second dummy pixel includes a second photoelectric conversion element, a second color filter formed over the second photoelectric conversion element, and a second micro-lens formed over the second color filter. A center point of the first micro-lens is aligned with a center point of the first photoelectric conversion element, and a center point of the second micro-lens is shifted in a certain direction from a center point of the second photoelectric conversion element.

In another embodiment of the disclosed technology, an image sensing device includes a first dummy pixel region formed to include a first photoelectric conversion element, a first color filter, and a first micro-lens, a second dummy pixel region formed to enclose the first dummy pixel region, and include a plurality of second photoelectric conversion elements and a plurality of second color filters, and a third dummy pixel region formed to enclose the second dummy pixel region, and include a plurality of third photoelectric conversion elements, a plurality of third color filters, and a plurality of second micro-lenses. A center point of the first micro-lens is aligned with a center point of the first photoelectric conversion element, and a center point of the second micro-lenses is shifted in one side direction from a center point of the third photoelectric conversion elements.

In another embodiment of the disclosed technology, an image sensing device includes a first dummy pixel region formed to include a first dummy pixel, a second dummy pixel region formed to enclose the first dummy pixel region, and include a plurality of second dummy pixels, a third dummy pixel region formed to enclose the second dummy pixel region, and include a plurality of third dummy pixels; a device isolation film formed to define active regions of the first to third dummy pixels, and grid structures formed over the device isolation film, and located at boundary regions of the first to third dummy pixels. A first grid structure located at a boundary region of the first dummy pixel is aligned with the device isolation film, and a second grid structure located at boundary regions of the second and third dummy pixels is shifted in one side direction from the device isolation film.

In another embodiment of the disclosed technology, an image sensing device includes an active pixel region formed to include a plurality of active pixels, and a dummy pixel region located outside of the active pixel region. The dummy pixel region includes a first dummy pixel and second dummy pixels formed in a peripheral part of the first dummy pixel. The first dummy pixel includes a first photoelectric conversion element, a first color filter formed over the first photoelectric conversion element, and a first micro-lens formed over the first color filter. The second dummy pixel includes a second photoelectric conversion element, a second color filter formed over the second photoelectric conversion element, and a second micro-lens formed over the second color filter. A center point of the first micro-lens is aligned with a center point of the first photoelectric conversion element, and a center point of the second micro-lens is shifted in one side direction from a center point of the second photoelectric conversion element.

In another embodiment of the disclosed technology, an image sensing device includes an imaging sensing array of imaging pixels operable to respond to light produce imaging pixel signals, and a peripheral region formed adjacent to the imaging sensing array to include an optical sensing region that detects incident light at the peripheral region to indicate a performance of the image sensing device without being used for imaging. The optical sensing region in the peripheral region includes a first pixel region formed to include a first photoelectric conversion element, a first color filter, and a first micro-lens; a second pixel region formed to surround the first pixel region and include a plurality of second photoelectric conversion elements and a plurality of second color filters, and a third pixel region formed to surround the second pixel region and include a plurality of third photoelectric conversion elements, a plurality of third color filters, and a plurality of second micro-lenses. A center point of the first micro-lens is aligned with a center point of the first photoelectric conversion element, and a center point of the second micro-lenses is shifted in a certain direction from a center point of the third photoelectric conversion elements.

In another embodiment of the disclosed technology, An image sensing device includes a plurality of imaging pixels to convert light incident upon the active pixels to electrical signals corresponding to the amount of the incident light; one or more overlay pixels including grid structures and isolation structures that are aligned with the one or more overlay pixels; and one or more non-imaging pixels surrounding the one or more overlay pixels, the one or more non-imaging pixels including grid structures and isolation structures that are misaligned with the one or more non-imaging pixels. The one or more overlay pixels are formed with micro-lenses thereon, and wherein the one or more non-imaging pixels include non-imaging pixels that are immediately adjacent to the one or more overlay pixels formed without micro-lenses thereon.

BRIEF DESCRIPTION OF THE DRAWINGS

The above and other features and advantages of the disclosed technology will become readily apparent by reference to the following detailed description when considered in conjunction with the accompanying drawings wherein:

FIG. 2A is a representation of an example of an arrangement of isolation layers and photoelectric conversion elements implemented in an overlay pattern region shown in FIG. 1;

FIG. 2B is a representation of an example of an arrangement of grid structures implemented in the overlay pattern region shown in FIG. 1;

FIG. 2C is a representation of an example of an arrangement of color filters implemented in the overlay pattern region shown in FIG. 1;

FIG. 2D is a representation of an example of an arrangement of micro-lenses implemented in the overlay pattern region shown in FIG. 1;

FIG. 3A shows a cross section of an example of a stacked structure taken along the lines A-A' shown in FIGS. 2A to 2D;

FIG. 3B shows a cross section of an example of a stacked structure taken along the lines B-B' shown in FIGS. 2A to 2D;

FIG. 3C is shows a cross section of an example of a stacked structure taken along the lines C-C' shown in FIGS. 2A to 2D;

FIG. 5A is a representation of an example of an arrangement of isolation layers and photoelectric conversion elements implemented in an overlay pattern region shown in FIG. 4;

FIG. 5B is a representation of an example of an arrangement of grid structures implemented in the overlay pattern region shown in FIG. 4;

DETAILED DESCRIPTION

Figure 1:
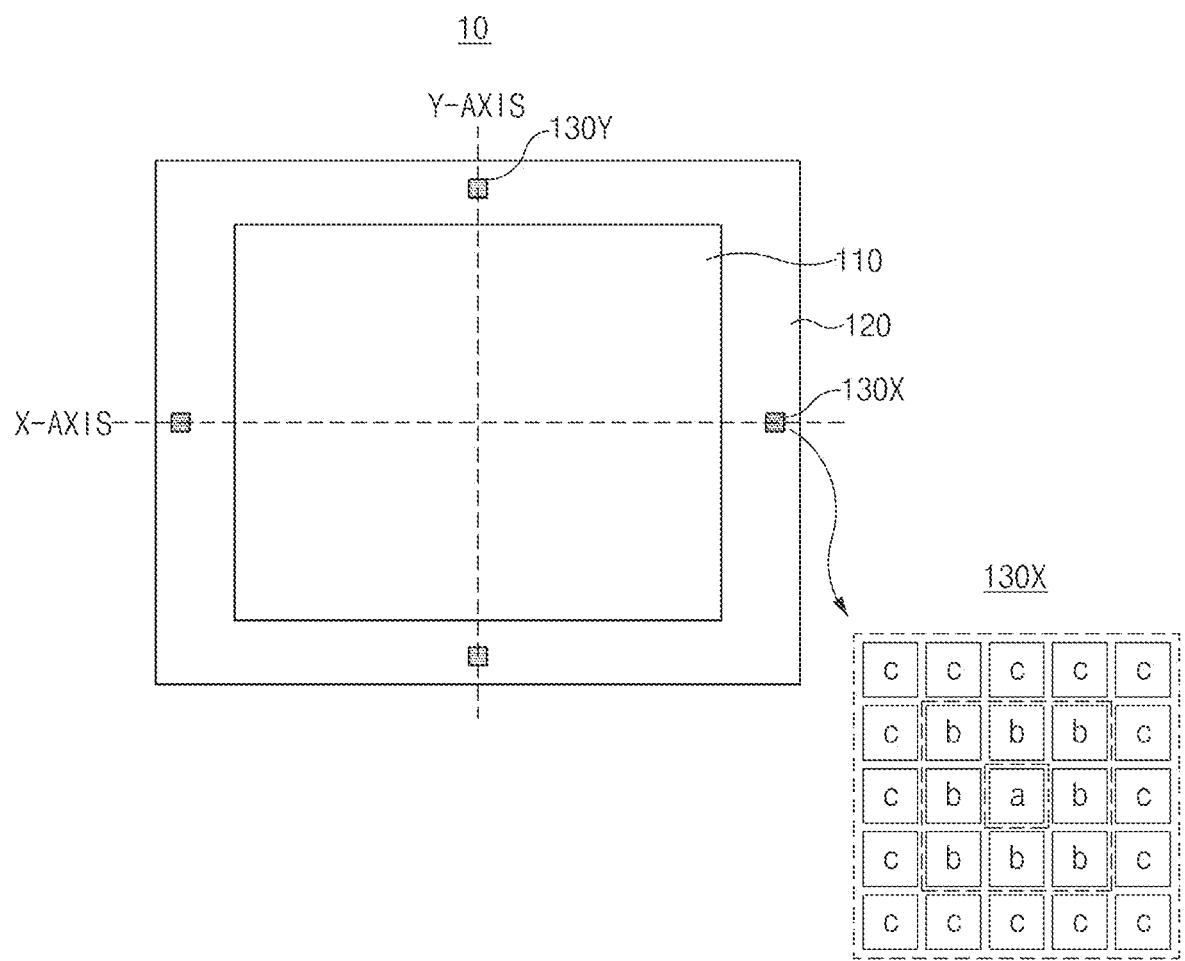
FIG. 1 is a representation of an example of an image sensing device implemented based on an embodiment of the disclosed technology.

An imaging sensor array of imaging pixels can be used to convert received incident light onto different imaging pixels into electrical charges or signals to represent images carried in the incident light. The imaging pixels can be semiconductor photosensors formed a substrate such as CMOS sensors. In an imaging device such as a digital camera, a camera lens system that often includes a set of camera lenses is provided to capture incident light from a target object or scene onto the imaging sensor array and a pixel optical structure formed over the imaging pixels in the imaging sensor array is used to receive the incident light from the camera lens system and to break the received incident light into individual pixel light beams to individual imaging pixels. In many imaging devices, the pixel optical structure formed over the imaging pixels can include an array of microlenses that spatially correspond to the imaging pixels in the imaging sensor array to improve the optical collection efficiency and may also include optical color filters that are placed to spatially correspond to the imaging pixels for capturing the color information of images.

This combination of the camera imaging lens system and the pixelated pixel optical structure has several technical issues that may adversely impact the imaging performance. For example, the captured light by the camera lens system is directed towards the imaging sensor array of imaging pixels at different angles and this can cause undesired imaging issues at the imaging sensor array after passing through the pixelated pixel optical structure over the imaging pixels. A line between an object point and the center of the camera lens is referred to as a "chief ray" and the angle between each chief ray and the optical axis of the camera lens system is a chief ray angle (CRA). Therefore, the captured light by the camera lens system is directed towards the imaging sensor array of imaging pixels at different CRA angles. The CRA of the light at the center of the image is zero, but the CRA of light at other lens positions increases from the center of the lens toward the edges of the lens (i.e., corners of the capture image). Accordingly, the off-center imaging pixels will receive light at CRA angles that increase toward the edges of the images. It is well known that this can cause undesired shading variations in the capture images, e.g., the edge of the image may appear darker than the center of the image.

One way to reduce this undesired shading due to the different CRAs of the captured light is to create spatial shifts of micro-lenses relatively to the underlying imaging pixels in connection with the positions of individual imaging pixels in the imaging sensor array in designing and fabricating such imaging sensor arrays based on the known lens parameters of the camera lens or lens system for the imaging sensor array. The technology disclosed in this patent application includes imaging sensor designs having imaging areas on an imaging sensor array to allow for optical imaging operations to measure the actual image shifts caused by the large CRAs of incident light near the outer edge of the imaging sensor array to evaluate whether a fabricated imaging sensor array with built-in microlens shifts can reduce the undesired shading variation to an acceptable level and thus can be served as a quality control measure.

FIG. 1 is a representation of an example of an image sensing device implemented based on an embodiment of the disclosed technology.

Referring to FIG. 1, the image sensing device 10 may include an active pixel region 110 and a peripheral region 120 which may be referred to as a dummy pixel region.

The active pixel region 110 may include a plurality of active pixels that are arranged in a two-dimensional (2D) matrix form. Here, the plurality of active pixels may include normal imaging pixels that convert received incident light at the different imaging pixels into electrical charges or signals to represent images carried in the incident light. For example, the plurality of active pixels may include a plurality of red pixels (Rs), a plurality of green pixels (Gs), and a plurality of blue pixels (Bs). In an implementation of the disclosed technology, the red pixels (Rs), the green pixels (Gs), and the blue pixels (Bs) may be arranged to form an RGGB Bayer pattern in the active pixel region 110. On top of the normal imaging pixels, an array of different color filters may be placed to cover the normal imaging pixels to filter the incident light in different colors at different pixel locations to capture the color information in a sensed image. For example, the color filters may include an arrangement of red (red), green (G) and blue (B) color filters in some reparative patterns such as the Bayer color filter pattern to capture color imaging information. Each of the active pixels may include a light receiving element such as a photoelectric conversion element for converting incident light into an electrical signal. Here, the photoelectric conversion element may receive light at a light receiving surface and generate electric charges corresponding to an intensity of received light. Examples of the photoelectric conversion element may include a photodiode, a phototransistor, a photogate, or a pinned photodiode.

The dummy pixel region 120 may be located at an outer adjacent area of the active pixel region 110. For example, the dummy pixel region 120 may be an area that surrounds the active pixel region 110 or on one or mode peripheral areas of the active pixel region 110. The dummy pixel region 120 may include a plurality of dummy pixels, and the dummy pixels may be arranged in a two-dimensional (2D) matrix form. In an example embodiment of the disclosed technology, the dummy pixels may be used for different purposes than the active pixels. For example, the dummy pixels may be non-imaging pixels that form an overlay pattern used for alignment. In a similar way to the active pixels, the dummy pixels may include a plurality of red pixels (Rs), a plurality of green pixels (Gs), and a plurality of blue pixels (Bs). The red pixels (Rs), the green pixels (Gs), and the blue pixels (Bs) may be arranged to form an RGGB Bayer pattern in the dummy pixel region 120.

In an embodiment of the disclosed technology, the overlay patterns 130X and 130Y may be formed in such a way that an overlay pixel having a micro-lens thereon is surrounded by other dummy pixels that do not have micro-lens thereon, thereby making the overlay pixel noticeable. The overlay patterns 130X and 130Y are formed in the dummy pixel region 120 outside the active pixel region 110. In order to measure the shift in the X direction and Y direction, overlay patterns 130X and 130Y may be formed at a certain location of an X-directional axis (X-axis) and a certain location of a Y-directional axis (Y-axis) in the dummy pixel region 120. For example, the overlay patterns 130X and 130Y may be formed in an edge region of the dummy pixel region 120. Each of the overlay patterns 130X and 130Y may include a first dummy pixel "a," a plurality of second dummy pixels "b," and a plurality of third dummy pixels "c." In more detail, the first dummy pixel "a" may be located at the center of each overlay pattern 130X or 130Y, the second dummy pixels "b" may be arranged to surround the first dummy pixel "a" while being adjacent to the first dummy pixel "a," and the third dummy pixels "c" may be arranged to surround the second dummy pixels "b" while being adjacent to the second dummy pixels "b." In an embodiment of the disclosed technology, the first dummy pixels and the third dummy pixels all have micro-lenses thereon, and the second dummy pixels are formed without micro-lenses thereon. Here, the first dummy pixel may be used as an overlay pixel that can be used to conform the arrangement of the pixel array.

The above-mentioned dummy pixels "a," "b," and "c" in each of the overlay patterns 130X and 130Y will be discussed in more detail later.

In order to prevent or reduce the shading variation, the active pixels of the active pixel region 110 and/or the dummy pixels of the dummy pixel region 120 may be implemented such that micro-lenses, color filters, and grid structures are shifted by a predetermined distance corresponding to a chief ray angle (CRA) of each pixel in an outward direction of the active pixel region 110 and/or the dummy pixel region 120 In other words, the micro-lenses, the color filters, and the grid structures are shifted by the predetermined distance corresponding to the CRA of each pixel in the outward direction of the active pixel region 110 and the dummy pixel region 120.

Although FIG. 1 illustrates that the dummy pixel region 120 is formed to surround the active pixel region 110 for convenience of description, the present disclosure is not limited thereto. For example, the dummy pixel region 120 may also be formed at one side of the active pixel region 110. In addition, the size of the dummy pixel region 120 may vary depending on fabrication parameters.

Although FIG. 1 illustrates two overlay patterns 130X located at an X-axis and two overlay patterns 130Y located at a Y-axis for convenience of description, the present disclosure is not limited thereto, and thus one overlay pattern may be formed at the X-axis and the other one overlay pattern may be formed at the Y-axis as necessary.

FIGS. 2A to 2D are plan views illustrating, among other overlay patterns shown in FIG. 1, structures formed in an overlay pattern region indicated by reference character "130X."

FIG. 2A illustrates an arrangement of isolation layers 220 and photoelectric conversion elements 230 implemented in the overlay pattern (130X) region. FIG. 2B illustrates an arrangement of grid structures 320 implemented in the overlay pattern (130X) region. FIG. 2C illustrates an arrangement of color filters 330 implemented in the overlay pattern (130X) region. FIG. 2D illustrates an arrangement of micro-lenses 350a and 350c implemented in the overlay pattern (130X) region.

Referring to FIG. 2A, the isolation layers 220 may define active regions on a semiconductor substrate, and may allow the photoelectric conversion elements (e.g., photodiodes: PDs) formed in the active regions to be optically and electrically isolated from each other. Each isolation layer 220 may be formed by burying an insulation material in a trench formed by etching the semiconductor substrate to a predetermined depth. The isolation layers 220 may be formed to be spaced apart from each other by the same distance, irrespective of the CRA of the dummy pixels. For example, the isolation layers 220 may include a plurality of first line-type isolation layers and a plurality of second line-type isolation layers formed to cross the plurality of first line-type isolation layers. The first line-type isolation layers may be spaced apart from each other by a predetermined distance while being arranged parallel to each other in an X-axis direction, and the second line-type isolation layers may be spaced apart from each other by a predetermined distance while being arranged parallel to each other in a Y-axis direction, thereby defining the active regions in which photoelectric conversion elements 230 of the unit pixels are formed.

In FIG. 2A, the photoelectric conversion elements 230 formed in the active regions defined by the isolation layers 220 may include a first photoelectric conversion element 230a of the dummy pixel "a", second photoelectric conversion elements 230b of the dummy pixels "b" that are formed to surround the dummy pixel "a" while being adjacent to the dummy pixel "a," and third photoelectric conversion elements 230c of the dummy pixels "c" that are located outside of the dummy pixels "b" while being adjacent to the dummy pixels "b."

Referring to FIG. 2B, a grid structure 320 may prevent occurrence of optical crosstalk between adjacent dummy pixels (a, b, and c). Each grid structure 320 may be located at a boundary region of the dummy pixels (a, b, and c). In more detail, the grid structure 320 may be located at a boundary region of the color filters of the dummy pixels (a, b, and c). In an embodiment of the disclosed technology, the grid structure 320 may be formed in the color filter layer, or in another embodiment of the disclosed technology the grid structure 320 may be formed in a transparent planarization film situated between the color filter layer and the semiconductor substrate. In order to prevent or reduce the shading variation, the grid structure 320 may be shifted by a predetermined distance in the X-axis direction according to CRA of each of the dummy pixels "b" and "c." Although FIG. 2B illustrates the overlay pattern 130X located at the X-axis and the grid structure 320 shifted by a predetermined distance in the X-axis direction for convenience of description, the present disclosure is not limited thereto, and it should be noted that the grid structure of the other overlay pattern 130Y located at the Y-axis can also be shifted by a predetermined distance in the Y-axis direction as necessary.

However, the grid structure of the center dummy pixel "a" of the overlay pattern 130X may be formed, without being shifted relatively, at a position aligned with the isolation layer 220 formed to define the active region where the photoelectric conversion element 230a is formed. That is, the grid structure of the center dummy pixel "a" of the overlay pattern 130X may be formed to overlap with the isolation layer 220 in a vertical direction. In other words, the grid structure located at a boundary region of the dummy pixel "a" may be aligned with the corresponding photoelectric conversion element 230a without being shifted to another position. In the overlay pattern (130X) region, contiguous grid structures located at both sides of the grid structure of the dummy pixel "a," among other grid structures meeting the X-axis, may be removed. In other words, grid structures are not formed at boundary regions between the dummy pixels "b" and the dummy pixels "c" (e.g., at boundary regions between the color filters of the dummy pixels "b" and the color filters of the dummy pixels "c").

As described above, by removing (or by omitting) the contiguous grid structures located at both sides (e.g., at both sides in the X-axis direction) of the dummy pixel "a" while retaining only the grid structure of the center dummy pixel "a" without shifting it in the overlay pattern (130X) region, the grid structure of the dummy pixel "a" can be easily distinguished from surrounding grid structures. Therefore, the grid structure of the dummy pixel "a" may be used as an arrangement mark for overlay measurement.

Similarly, in the overlay pattern (130Y) region located at the Y-axis, the center dummy pixel "a" is not shifted and the contiguous grid structures located at both sides (i.e., at both sides in the Y-axis direction) of the dummy pixel "a" are removed.

Referring to FIG. 2C, the color filters (R, G, B) 330 may be shifted by a predetermined distance in the X-axis direction according to CRA of each dummy pixel "b" or "c" in the same manner as in the above-mentioned grid structures. Specifically, in the overlay pattern (130X) region, the color filters (R, G, B) 330 may be arranged in the RGGB Bayer pattern, and all of the color filters meeting the X-axis may be formed of only the same color filters. For example, in the overlay pattern (130X) region, all of the color filters meeting the X-axis may be formed of the green color filters (G).

As described above, the grid structures may not be shifted with respect to the center dummy pixel "a" of the overlay pattern (130X) region. In addition, as shown in FIG. 2D, the micro-lens 350a is not shifted with respect to the center dummy pixel "a." However, all the color filters in the overlay pattern (130X) region may be shifted.

Likewise, when only the color filters are shifted with respect to the dummy pixel "a" under the condition that the grid structures and the micro-lenses are not shifted with respect to the dummy pixel "a," interference occurring between different colors may result in a thickness distortion between the color filters during overlay measurement. Therefore, in order to prevent such thickness distortion between the color filters with respect to the dummy pixel "a," all the color filters (e.g., all the color pixels located along the same line as the dummy pixel "a") meeting the X-axis within the overlay pattern (130X) region may be formed of the same color filters only.

Although FIG. 2C illustrates that all the color filters meeting the X-axis in the overlay pattern (130X) region are formed of the same color filters for convenience of description, the present disclosure is not limited thereto, and it should be noted that all the color filters meeting the Y-axis within the overlay pattern (130Y) region may also be formed of the same color filters.

Referring to FIG. 2D, micro-lenses 350a and 350c may be formed over the color filters 330. The micro-lens 350a may be formed over the dummy pixel "a," and no micro-lenses may be formed over the dummy pixels "b" formed to surround the dummy pixel "a," and the micro-lenses 350c may be formed in the dummy pixels "c" located outside of the dummy pixels "b" while surrounding the dummy pixels "b." That is, the micro-lens 350a of the dummy pixel (a) may be formed as an island type that is spaced apart from each of the peripheral micro-lenses 350c by a predetermined distance of about 1 pixel without contacting with the peripheral micro-lenses 350c. As described above, the micro-lens 350a will look like an island spaced apart from peripheral micro-lenses 350c by a predetermined distance, such that the overlay pattern can be easily distinguished and identified from others when shown in a top-view.

In this case, while the micro-lenses 350c are shifted by a predetermined distance in the X-axis direction according to CRA of each dummy pixel "c," the micro-lens 350a of the dummy pixel "a" is not shifted at all. That is, the micro-lens 350a may be aligned with the center point of the photoelectric conversion element 230a.

FIGS. 3A to 3C are cross-sectional views illustrating examples of the overlay pattern 130X. FIG. 3A illustrates a cross section of an example of a stacked structure taken along the lines A-A' shown in FIGS. 2A to 2D. FIG. 3B illustrates a cross section of an example of a stacked structure taken along the lines B-B' shown in FIGS. 2A to 2D. FIG. 3C illustrates a cross section of an example of a stacked structure taken along the lines C-C' shown in FIGS. 2A to 2D.

Referring to FIGS. 3A to 3C, the image sensing device 10 implemented based on an embodiment of the disclosed technology may include a semiconductor layer 200 and a light transmission layer 300 formed at one side of the semiconductor layer 200.

The semiconductor layer 200 may include a semiconductor substrate 210, isolation layers 220, and a plurality of photoelectric conversion elements 230.

The semiconductor substrate 210 may be in a single crystal state, and may include a silicon-containing material. That is, the semiconductor substrate 210 may include a monocrystalline-silicon-containing material. The semiconductor substrate 210 may include P-type impurities implanted by ion implantation technique.

Each isolation layer 220 may include an insulation film that is buried in a trench etched to a predetermined depth. The isolation layers 220 may define an active region in which the photoelectric conversion elements 230 are formed, and may allow the photoelectric conversion elements 230 to be optically and electrically isolated from each other.

The photoelectric conversion elements 230 may be formed in the active region defined by the isolation layers 220. The photoelectric conversion elements 230 may be formed by implanting N-type impurities in the active region through ion implantation. For example, each of the photoelectric conversion elements 230 may include a photodiode, a phototransistor, a photogate, or a pinned photodiode.

The light transmission layer 300 may include a first planarization layer 310, a grid structure 320, a color filter layer 330, a second planarization layer 340, and a micro-lens layer 350.

The first planarization layer 310 may be formed over one side of the semiconductor layer 200. The first planarization layer 310 may have light transmission characteristics and insulation characteristics. The first planarization layer 310 may include a transparent insulation layer, a refractive index (n1) of which is lower than a refractive index (n2) of the semiconductor layer 200 (i.e., n1<n2). The transparent insulation layer may include silicon oxide ($SiO_2$), silicon nitride (SiN), silicon oxynitride (SiON), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cesium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), resin, or a combination thereof.

The grid structure 320 may be formed over the first planarization layer 310. The grid structure 320 may be formed of a light shielding material, for example, tungsten (W), aluminum (Al), or copper (Cu). The grid structure 320 may be formed in a boundary region of the color filters 330, and may be shifted by a predetermined distance in the X-axis direction according to CRA of the corresponding dummy pixel. For example, the grid structure 320 may be shifted with respect to the isolation layers 220 by a predetermined distance in the X-axis direction.

In an embodiment of the disclosed technology, as shown in FIG. 3A, the grid structure 320 corresponding to the dummy pixel "a," among other grid structures 320, may be aligned with the photoelectric conversion element 230a without being shifted. The grid structures corresponding to the isolation layers disposed between the photoelectric conversion elements 230b and 230c (e.g., grid structures denoted by dotted lines in FIG. 3A) may be omitted.

The color filter layer 330 may be formed over the first planarization layer 310 and the grid structures 320. The color filter layer 330 may include color filters that capture color information. The color filter layer 330 may receive incident light through the micro-lens layer 350 and the second planarization layer 340, and may allow only visible light with certain wavelength ranges to pass therethrough. The color filter layer 330 may include a plurality of red filters (Rs), a plurality of green filters (Gs), and a plurality of blue filters (Bs). Each red filter (R) may filter the incident light to obtain information about red light, each green filter (G) may filter the incident light to obtain information about green light, and each blue filter (B) may filter the incident light to obtain information about blue light.

The color filters (Rs, Gs, and Bs) may be arranged in a Bayer pattern. In an embodiment of the disclosed technology, as shown in FIG. 3A, all the color filters arranged along the X-axis in the overlay pattern (130X) region may be composed of the same color filters. For example, all the color filters arranged along the X-axis in the overlay pattern (130X) region may be "green" filters.

The second planarization layer 340 may be formed over the color filter layer 330. The second planarization layer 340 may include an organic material such as resin or the like.

The micro-lens layer 350 may be formed over the second planarization layer 340, and may include a plurality of micro-lenses 350a and 350c. The micro-lenses 350a and 350c may direct incident light onto the condensed light to the color filter layer 330.

The micro-lenses 350c may be shifted by a predetermined distance in the X-axis direction according to CRA of the corresponding dummy pixels "c." However, the micro-lens 350a of the dummy pixel "a" may not be shifted, and may be aligned with the photoelectric conversion element 230a, as shown in FIG. 3A.

In addition, the micro-lens 350a may be spaced apart from each of the micro-lenses 350c by a predetermined distance of about 1 pixel.

As described above, the micro-lens 350a of a specific dummy pixel "a" (e.g., overlay pixel) implemented based on some embodiments of the disclosed technology will look like an island since it is spaced apart from surrounding micro-lenses 350c by a predetermined distance, such that the position of the dummy pixel "a" (e.g., overly pixel) can be easily distinguished from other dummy pixels when shown in a top-view.

In addition, in an embodiment of the disclosed technology, the grid structure and the micro-lens 350a of the dummy pixel "a" may not be shifted, and instead may be aligned with the photoelectric conversion element 230a of the dummy pixel "a." The grid structure and the micro-lens 350a of the dummy pixel "a" may also allow the color filters located along the same axis as in the dummy pixel "a" in the overlay pattern region to be formed of the same color, such that an arrangement of the pixels can be easily confirmed through a transmission electron microscopy (TEM).

Although the above-mentioned embodiments show that the overlay pattern 130X are arranged along the X-axis for convenience of description, the present disclosure is not limited thereto, and it should be noted that the overlay pattern 130X located at a certain position of the X-axis and the other overlay pattern 130Y located at a certain position of the Y-axis may be identical in shape but different in directions. For example, the overlay pattern 130Y may be identical to the overly pattern 130X rotated by 90° with respect to the center point of the active pixel region 110.

Although FIG. 3 shows that the light transmission layer 300 is formed at only one side of the semiconductor layer 200 for convenience of description, it is possible to have, at the other side, various elements capable of reading out electrical signals generated by the photoelectric conversion elements 230 while simultaneously controlling the unit pixels.

Figure 4:
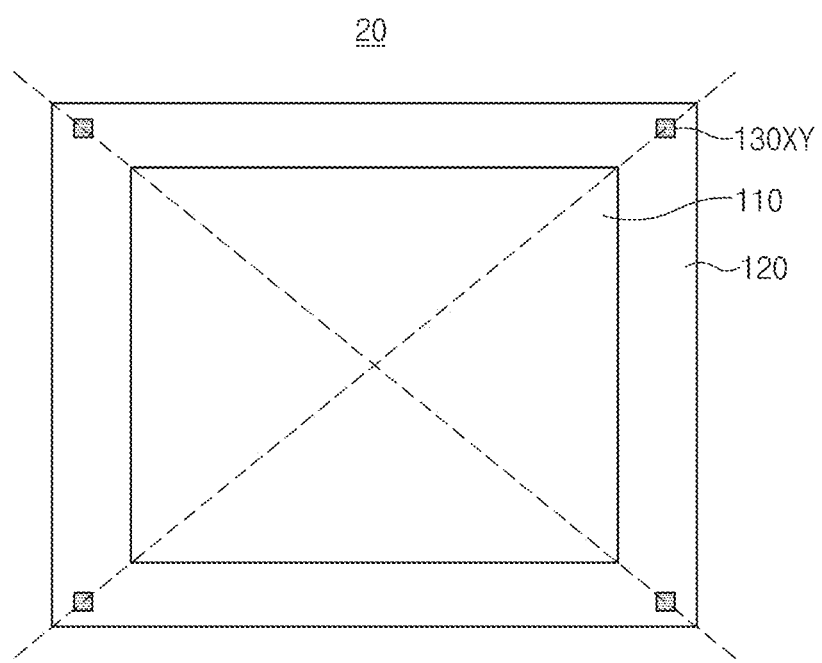
FIG. 4 is a representation of an example of an image sensing device implemented based on another embodiment of the disclosed technology.

FIG. 4 is a representation of an example of an image sensing device 20 implemented based on another embodiment of the disclosed technology.

Referring to FIG. 4, the image sensing device 20 may include overlay patterns 130XY that are formed at positions different from those of the image sensing device 10 of FIG. 1.

Unlike the image sensing device 10 of FIG. 1, the image sensing device 20 of FIG. 4 includes the overlay patterns 130XY located at corners of the dummy pixel region 120. For example, the overlay patterns 130XYs may be formed at certain positions on diagonal lines as illustrated in FIG. 4.

FIGS. 5A to 5D are plan views illustrating structures formed in an overlay pattern (130XY) region shown in FIG. 4.

FIG. 5A illustrates an arrangement of isolation layers 220' and photoelectric conversion elements 230' implemented in the overlay pattern (130XY) region. FIG. 5B illustrates an arrangement of grid structures 320' implemented in the overlay pattern (130XY) region. FIG. 2C illustrates an arrangement of color filters 330' implemented in the overlay pattern (130XY) region. FIG. 2D illustrates an arrangement of micro-lenses 350a' and 350c' implemented in the overlay pattern (130XY) region.

Referring to FIG. 5A, the isolation layers 220' in the overlay pattern (130XY) region may be formed to be spaced apart from each other by the same distance, irrespective of the CRA of the dummy pixels, and may be formed to define the active region in which the photoelectric conversion elements 230' are formed.

In FIG. 5A, the photoelectric conversion elements 230' may include a first photoelectric conversion element 230a of the dummy pixel "a," second photoelectric conversion elements 230b of the dummy pixels "b" that are formed to surround the dummy pixel "a" while being adjacent to the dummy pixel "a," and third photoelectric conversion elements 230c that are located outside of the dummy pixels "b" while being adjacent to the dummy pixels "b."

Referring to FIG. 5B, in order to prevent or reduce the shading variation, the grid structures 320' may be shifted by a predetermined distance in the X-axis and Y-axis directions (e.g., in diagonal directions) according to CRA of each of the dummy pixels "b") and "c." However, in the overlay pattern (130XY) region, the grid structure corresponding to the photoelectric conversion element 230a of the dummy pixel "a" is not shifted, and is aligned with the isolation layers 220 formed to define the active region provided with the photoelectric conversion element 230a.

In an embodiment of the disclosed technology, grid structures are not formed at a boundary region of the dummy pixels "b" (e.g., a boundary region of the color filters of the dummy pixels "b"). That is, the grid structure may not be formed between the color filters of the dummy pixels "b," such that the grid structure corresponding to the photoelectric conversion element 230a of the dummy pixel "a" may be formed in a square-loop shape isolated from surrounding grid structures.

Likewise, in the overlay pattern (130XY) region, the grid structure corresponding to the dummy pixel "a" is not shifted, and is isolated from other grid structures, such that the grid structure corresponding to the dummy pixel "a" may be used as an arrangement mark (e.g., overlay pixel) for overlay measurement.

Figure 5C:
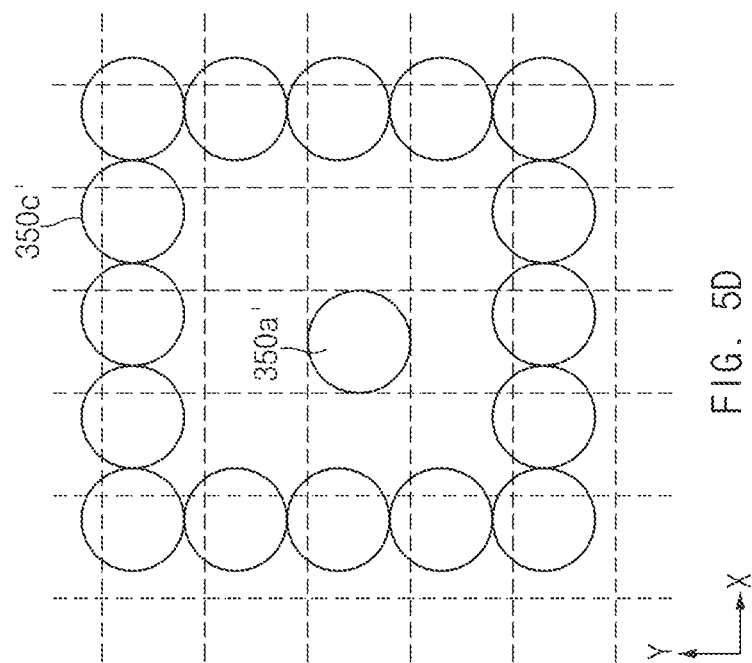
FIG. 5C is a representation of an example of an arrangement of color filters implemented in the overlay pattern region shown in FIG. 4.

Referring to FIG. 5C, the color filters (R, G, B) 330' may be shifted by a predetermined distance in the X-axis and Y-axis directions according to CRA of each of the dummy pixels "a," "b" and "c." In this case, the color filter of the dummy pixel "a" and the color filters of the dummy pixels "b" may be composed of the same color filters only, thereby preventing thickness distortion between the color filters. For example, the color filter of the dummy pixel "a" and the color filters of the dummy pixels "b" may be formed of the green color filters (G).

Figure 5D:
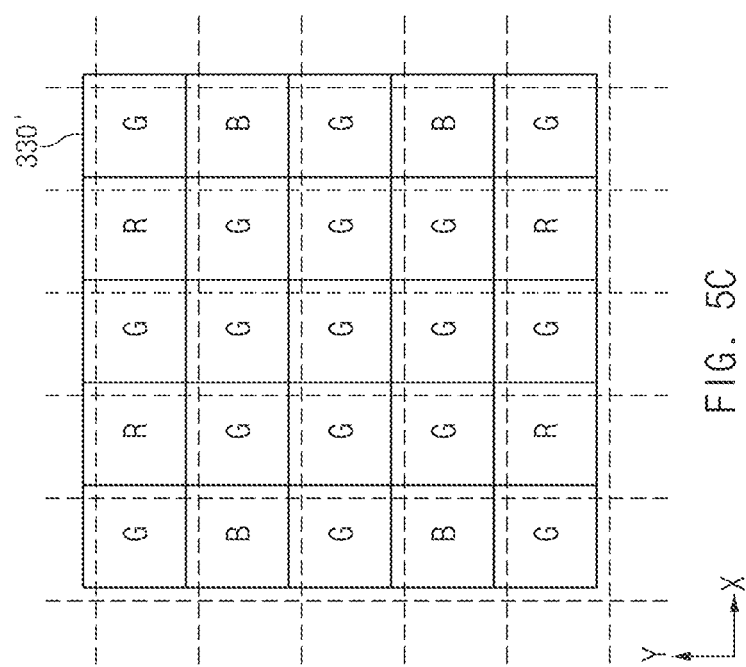
FIG. 5D is a representation of an example of an arrangement of micro-lenses implemented in the overlay pattern region shown in FIG. 4.

Referring to FIG. 5D, the micro-lenses 350a' and 350c' may be formed over the color filters 330'. The micro-lens 350a' may be formed over the dummy pixel "a," and the micro-lenses 350c' may be formed in the dummy pixels "c." However, no micro-lens is formed in the dummy pixels "b." That is, the micro-lens 350a' of the dummy pixel "a" will look like an island spaced apart from the surrounding micro-lenses 350c' by a predetermined distance of about 1 pixel. As described above, the micro-lens 350a' is separated from surrounding micro-lenses 350c' by a predetermined distance, such that the position of the overlay pattern can be easily distinguished when shown in a top-view.

In this case, while the micro-lenses 350c' are shifted by a predetermined distance in the X-axis and Y-axis directions according to CRA of each dummy pixel "c," the micro-lens 350a' of the dummy pixel "a" is not shifted at all. That is, the micro-lens 350a' may be aligned with the center point of the photoelectric conversion element 230a.

As is apparent from the above description, the image sensing device implemented based on some embodiments of the disclosed technology can form an overlay pattern using dummy pixels to make it easier to search for an overlay pattern in a top-view to check an arrangement of pixels through a transmission electron microscopy (TEM).

An image sensing device implemented based on an embodiment of the disclosed technology includes a plurality of imaging pixels to convert light incident upon the active pixels to electrical signals corresponding to the amount of the incident light, one or more overlay pixels including grid structures and micro lenses that are aligned with photoelectric conversion elements of the one or more overlay pixels, and one or more non-imaging pixels surrounding the one or more overlay pixels, the one or more non-imaging pixels including grid structures that are misaligned with the photoelectric conversion elements of the one or more non-imaging pixels.

The one or more overlay pixels are formed with micro-lenses thereon, and the one or more non-imaging pixels include non-imaging pixels that are immediately adjacent to the one or more overlay pixels formed without micro-lenses thereon. The one or more non-imaging pixels include non-imaging pixels that are spaced apart from the one or more overlay pixels formed with micro-lenses thereon.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
a first pixel region formed to include a first pixel, the first pixel including a first photoelectric conversion element, a first color filter, and a first micro-lens;
a second pixel region formed to enclose the first pixel region and include a plurality of second pixels, each of the second pixels including a second photoelectric conversion element and a second color filter; and
a third pixel region formed to enclose the second pixel region and include a plurality of third pixels, each of the third pixels including a third photoelectric conversion element, a third color filter, and a second micro-lens,
wherein no micro-lens is formed over the second pixels.

2. The image sensing device according to claim 1, further comprising:
at least one isolation layer formed to define active regions in which the first photoelectric conversion element, the second photoelectric conversion elements, and the third photoelectric conversion elements are respectively formed.

3. The image sensing device according to claim 2, further comprising:
at least one grid structure located at a boundary region of the color filters to reduce optical crosstalk between adjacent pixels.

4. The image sensing device according to claim 3, wherein the at least one grid structure includes:
a first grid structure located at a boundary region of the first color filter; and
a second grid structure located at boundary regions of the second color filters and the third color filters,
wherein the first grid structure is aligned with an isolation layer formed to define the active region in which the first photoelectric conversion element is formed, and the second grid structure is shifted in a certain direction from the isolation layers formed to define the active region in which the second photoelectric conversion elements and the third photoelectric conversion elements are formed.

5. The image sensing device according to claim 4, wherein the second grid structure has a specific structure in which one or more grid structures are absent on an X-axis or a Y-axis at the boundary regions of the second color filters and the third color filters.

6. The image sensing device according to claim 4, wherein the second grid structure has a specific structure formed when at least one grid structure located at a boundary region of the second color filters is removed from the second pixel region.

7. The image sensing device according to claim 1, wherein color filters located on a certain location of an X-axis or a Y-axis, among the second color filters, have the same color as that of the first color filter.

8. The image sensing device according to claim 1, wherein the second color filters have the same color as that of the first color filter.

9. The image sensing device according to claim 1, wherein the first pixel region is located on a certain location of an X-axis, a Y-axis, or at least one diagonal line, each of which passes through a center point of an active pixel region.

10. An image sensing device comprising:
a first pixel region formed to include a first pixel, the first pixel including a first photoelectric conversion element, a first color filter, and a first micro-lens;
a second pixel region formed to enclose the first pixel region, and include a plurality of second pixels, each of the second pixels including a second photoelectric conversion element and a second color filter;
a third pixel region formed to enclose the second pixel region, and include a plurality of third pixels, each of the third pixels including a third photoelectric conversion element, a third color filter, and a second micro-lens;
at least one isolation layer formed to define active regions of the first to third pixels; and grid structures formed over the isolation layer, and located at boundary regions of the first to third pixels, wherein a first grid structure located at a boundary region of the first pixel is aligned with the isolation layer, and a second grid structure located at boundary regions of the second and third pixels is shifted in a certain direction from the isolation layer, wherein no micro-lens is formed over the second pixels.

11. The image sensing device according to claim 10, wherein the second grid structure has a structure in which one or more grid structures are absent on an X-axis or a Y-axis at the boundary regions of the second pixels and the third pixels.

12. The image sensing device according to claim 10, wherein the second grid structure has a structure formed when grid structures located at the boundary region of the second pixels are removed from the second pixel region.

13. The image sensing device according to claim 10, wherein:
the micro-lens of the first pixel is aligned with the first grid structure; and
the micro-lenses of the third pixels are aligned with the second grid structure.

14. The image sensing device according to claim 10, further comprising:
color filters located between the grid structures,
wherein color filters located on a certain location of an X-axis or a Y-axis, among color filters of the second pixels, have the same color as that of a color filter of the first pixel.

15. The image sensing device according to claim 10, further comprising:
color filters located between the grid structures,
wherein color filters of the second pixels have the same color as that of a color filter of the first pixel.

16. An image sensing device comprising:
an active pixel region formed to include a plurality of active pixels that convert incident light into pixel signals representing a capture image carried by the incident light; and
a peripheral pixel region located outside of the active pixel region to convert incident light into signals that are not used to represent the capture image carried by the incident light, wherein:
the peripheral pixel region includes a first pixel, second pixels formed in a region enclosing the first pixel and third pixels formed in a region between the first pixel and the second pixels and enclosing the first pixel;
wherein the first pixel includes a first photoelectric conversion element, a first color filter formed over the first photoelectric conversion element, and a first micro-lens formed over the first color filter;
wherein each of the second pixels include a second photoelectric conversion element, a second color filter formed over the second photoelectric conversion element, and a second micro-lens formed over the second color filter;
wherein each of the third pixels includes a third photoelectric conversion element and a third color filter formed over the third photoelectric conversion element; and
wherein no micro-lens is formed over the third pixels.

17. The image sensing device according to claim 16, wherein the first pixel is located on a certain location of an X-axis, a Y-axis, or at least one diagonal line, each of which passes through a center point of the active pixel region.

18. The image sensing device according to claim 16, wherein:
a center point of the first micro-lens is aligned with a center point of the first photoelectric conversion element, and a center point of the second micro-lens is shifted in a certain direction from a center point of the second photoelectric conversion element.

19. The image sensing device according to claim 1, wherein:
a center point of the first micro-lens is aligned with a center point of the first photoelectric conversion element, and a center point of the second micro-lenses is shifted in a certain direction from a center point of the third photoelectric conversion elements.

* * * * *